(12) United States Patent
Tatsuno et al.

(10) Patent No.: US 10,203,089 B2
(45) Date of Patent: Feb. 12, 2019

(54) LIGHT FLUX CONTROLLING MEMBER, LIGHT EMITTING DEVICE AND METHOD FOR MANUFACTURING LIGHT FLUX CONTROLLING MEMBER

(71) Applicant: Enplas Corporation, Saitama (JP)

(72) Inventors: Shuji Tatsuno, Saitama (JP); Hiroshi Motoki, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 15/641,462

(22) Filed: Jul. 5, 2017

(65) Prior Publication Data

US 2018/0010771 A1    Jan. 11, 2018

(30) Foreign Application Priority Data

Jul. 5, 2016    (JP) ................. 2016-133484

(51) Int. Cl.

| | |
|---|---|
| *F21V 13/04* | (2006.01) |
| *B29D 11/00* | (2006.01) |
| *F21V 5/04* | (2006.01) |
| *F21V 7/00* | (2006.01) |
| *F21Y 115/10* | (2016.01) |
| *B29K 83/00* | (2006.01) |
| *F21V 17/10* | (2006.01) |

(52) U.S. Cl.
CPC ........ *F21V 13/04* (2013.01); *B29D 11/00442* (2013.01); *F21V 5/04* (2013.01); *F21V 7/0066* (2013.01); *B29K 2083/00* (2013.01); *F21V 17/101* (2013.01); *F21Y 2115/10* (2016.08)

(58) Field of Classification Search
CPC .................................. F21V 13/04; F21V 5/04
See application file for complete search history.

(56) References Cited

U.S. PATENT DOCUMENTS

2015/0354786 A1* 12/2015 Ji ............................ F21V 5/04
315/297

FOREIGN PATENT DOCUMENTS

| CN | 103370182 A | 10/2013 |
|---|---|---|
| CN | 105221982 A | 1/2016 |
| JP | 2011-137896 A | 7/2011 |
| WO | 2012/111748 A1 | 8/2012 |

* cited by examiner

*Primary Examiner* — Nimeshkumar Patel
*Assistant Examiner* — Jacob R Stern
(74) *Attorney, Agent, or Firm* — Brundidge & Stanger, P.C.

(57) ABSTRACT

A light flux controlling member includes a lens body and a cut part. The lens body and the cut part are an integrally molded article composed of a cured product of a liquid resin composition. The cut part extends outward from the entire circumference of the outer peripheral part of the lens body in plan view of the light flux controlling member. The cut part includes the outward-facing end surface bearing a blade mark or a melting mark. In the front-rear direction of the light flux controlling member, the distance between the bottom surfaces of the cut part and the lens body is 20 μm or more.

9 Claims, 7 Drawing Sheets

LIGHT FLUX CONTROLLING MEMBER, LIGHT EMITTING DEVICE AND METHOD FOR MANUFACTURING LIGHT FLUX CONTROLLING MEMBER

CROSS REFERENCE TO RELATED APPLICATIONS

This application is entitled to and claims the benefit of Japanese Patent Application No. 2016-133484, filed on Jul. 5, 2016, the disclosure of which including the specification, drawings and abstract is incorporated herein by reference in its entirety.

TECHNICAL FIELD

The present invention relates to a light flux controlling member for controlling distribution of light emitted from a light emitting element, a light emitting device including the light flux controlling member, and a method for manufacturing the light flux controlling member.

BACKGROUND ART

Optical components (e.g., lens) composed of a cured product of a thermosetting resin are used in the fields of, e.g., various illuminating lamps, various electric appliances and automobiles, where heat resistance is required. Optical components composed of a cured product of a thermosetting resin may be manufactured, for example, using a lens array sheet molded in such a manner that a plurality of optical components is arranged in a planar direction (see, e.g., PTL 1).

FIG. 1 is a partial side view illustrating lens array sheet 1 described in PTL 1. Lens array sheet 1 includes adhesive sheet 2, and resin substrate 3 disposed on adhesive sheet 2. Resin substrate 3 includes a plurality of lens bodies 4. Notched sections 5 in the shape of a triangular prism are formed in resin substrate 3. Notched section 5 serves as a reference position during dicing of lens array sheet 1. A plurality of lenses can be manufactured easily by separating lens bodies 4 from each other with dicing of lens array sheet 1 from the front side thereof.

CITATION LIST

Patent Literature

PTL 1
Japanese Patent Application Laid-Open No. 2011-137896

SUMMARY OF INVENTION

Technical Problem

Since lenses (light flux controlling members) described in PTL 1 are manufactured by dicing of lens array sheet 1, the lenses may have a burr formed at a cut part in resin substrate 3. When the bottom surface of lens body 4 and the bottom surface in the vicinity of the cut part are at the same height as illustrated in FIG. 1, the burr may protrude below the bottom surface of lens body 4. In such a case, during mounting of a light flux controlling member on a substrate having a light emitting element mounted thereon, with bottom surface of lens body 4 and the bottom surface in the vicinity of the cut part as an installation surface, the light flux controlling member may be installed in a tilted state due to the burr. As a result, light distribution properties of the light flux controlling member may be lowered.

An object of the present invention is to provide a light flux controlling member, even with a burr being formed during manufacturing of the same, which is free from positional displacement due to the burr during mounting, and a method for manufacturing the light flux controlling member. Another object of the present invention is to provide a light emitting device including the light flux controlling member.

Solution to Problem

A light flux controlling member according to the present invention is configured to control distribution of light emitted from a light emitting element, the light flux controlling member including: a lens body which includes a first optical surface disposed on a rear side of the light flux controlling member and configured to allow light emitted from a light emitting element to enter the light flux controlling member, and a second optical surface disposed on a front side of the light flux controlling member and configured to transmit or reflect the light entering from the first optical surface; a cut part extending outward from an entire circumference of an outer peripheral part of the lens body in plan view of the light flux controlling member, in which the lens body and the cut part are an integrally molded article composed of a cured product of a liquid resin composition, the cut part includes an outward-facing end surface bearing a blade mark or a melting mark, and in a front-rear direction of the light flux controlling member, a distance between bottom surfaces of the cut part and the lens body is 20 μm or more.

A light emitting device according to the present invention includes: a light emitting element; a base supporting the light emitting element; and the light flux controlling member according to claim 1 disposed over the light emitting element, in which the light flux controlling member is disposed so that a light emitting surface of the light emitting element faces the first optical surface, and the bottom surface of the lens body is in contact with a top surface of the base.

A method for manufacturing a light flux controlling member according to the present invention is a method for manufacturing a light flux controlling member configured to control distribution of light emitted from a light emitting element, the method including: integrally molding a plurality of lens bodies and connecting parts to form a molded article by filling a cavity of a mold with a liquid resin composition followed by curing the composition, each lens body including a first optical surface disposed on a rear side of the lens body and configured to allow light emitted from a light emitting element to enter the lens body, and a second optical surface disposed on a front side of the lens body and configured to transmit or reflect the light entering from the first optical surface, and each connecting part extending outward from an entire circumference of an outer peripheral part of the lens body and connecting the lens bodies; and cutting the connecting parts of the molded article from a front side thereof using a cutting blade or a laser, in which during the integrally molding of the lens bodies and the connecting parts, the molded article is integrally molded so that a distance between bottom surfaces of the connecting part and the lens body becomes 20 μm or more in a front-rear direction.

Advantageous Effects of Invention

The present invention can provide a light flux controlling member, even with a burr being formed during manufacturing of the same, which is free from positional displacement due to the burr during mounting, and a light emitting device including the same.

DESCRIPTION OF EMBODIMENTS

Hereinafter, embodiments of the present invention will be described in detail with reference to the accompanying drawings.

(Configuration of Light Emitting Device)

Figure 1:
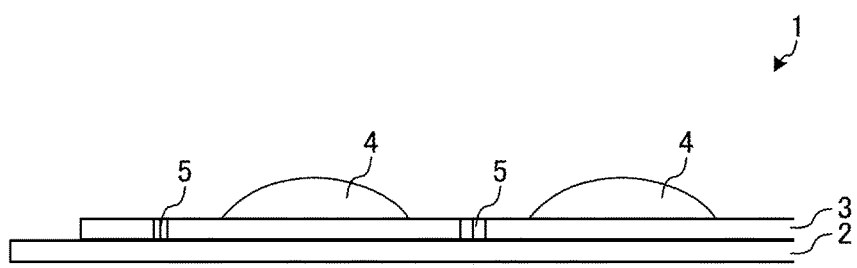
FIG. 1 is a partial side view of a lens array sheet described in PTL 1.
Figure 2:
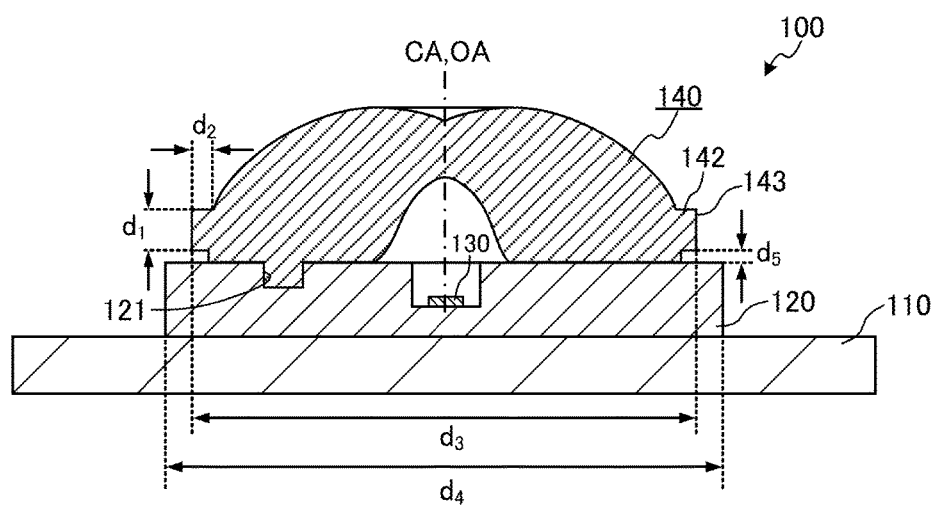
FIG. 2 is a sectional view illustrating a configuration of a light emitting device according to an embodiment.
Figure 3A:
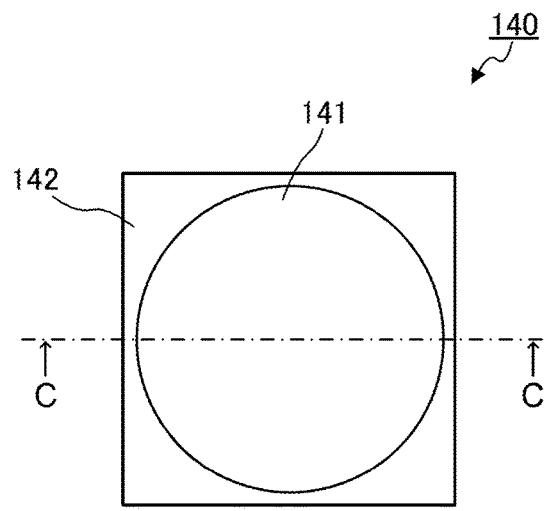
FIGS. 3A to 3C illustrate a configuration of a light flux controlling member according to the embodiment.
Figures 3B, 3C:
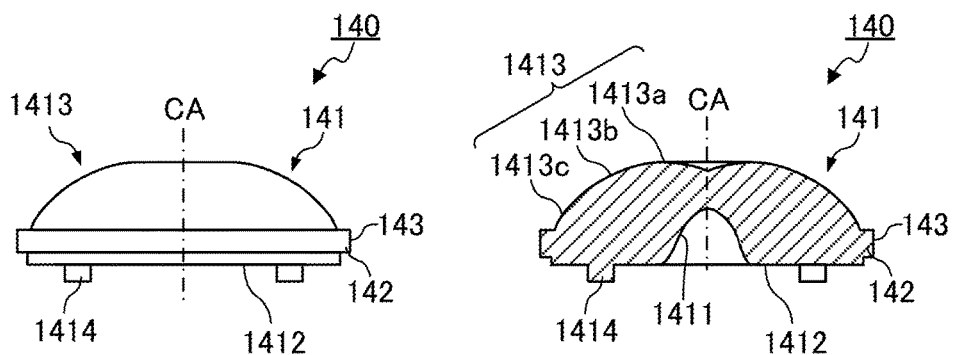

FIG. 2 is a sectional view illustrating a configuration of light emitting device 100 according to the present embodiment. FIGS. 3A to 3C illustrate a configuration of light flux controlling member 140 according to the present embodiment. FIG. 3A is a plan view of light flux controlling member 140 and FIG. 3B is a front view of the same, and FIG. 3C is a sectional view taken along line C-C of FIG. 3A. Light flux controlling member 140 of light emitting device 100 illustrated in FIG. 2 represents a sectional view taken along line C-C of FIG. 3A.

As illustrated in FIG. 2, light emitting device 100 includes substrate 110, base 120, light emitting element 130 and light flux controlling member 140.

Substrate 110 supports base 120, light emitting element 130 and light flux controlling member 140. Substrate 110 is appropriately selected in accordance with applications, and is, for example, a glass composite substrate, a glass epoxy substrate or a flexible substrate using a plastic film as a base material.

Base 120 supports light emitting element 130. Base 120 may have any shape, as long as base 120 supports light emitting element 130 and do not block light emitted from light emitting element 130. In the present embodiment, base 120 has a shape of a cuboid having a recess formed in the center part of the top surface of base 120. The inner surface of the recess is preferably a reflection surface.

Light emitting element 130 is a light source of light emitting device 100. Light emitting element 130 is housed in the recess of base 120, and may be encapsulated in, e.g., a resin. Light emitting element 130 is a light emitting diode (LED), for example. Base 120 and light emitting element 130 may be integrated into an LED package.

Light flux controlling member 140 is disposed over light emitting element 130, and configured to control a distribution of light emitted from light emitting element 130. More specifically, light flux controlling member 140 is disposed so that the light emitting surface of light emitting element 130 faces below-described incidence surface 1411, and the bottom surface of light flux controlling member 140 (lens body 141) is in contact with the top surface of base 120. In the present embodiment, light flux controlling member 140 is disposed so that central axis CA thereof coincides with optical axis OA of light emitting element 130. Below-described incidence surface 1411 and emission surface 1413 of light flux controlling member 140 are both rotationally symmetrical, and the rotation axes of the surfaces coincide with each other. Hereinafter, the rotation axes of incidence surface 1411 and emission surface 1413 are referred to as "central axis CA of a light flux controlling member." Further, "optical axis OA of a light emitting element" refers to a center beam of a light flux emitted three-dimensionally from light emitting element 130.

As illustrated in FIGS. 3A to 3C, light flux controlling member 140 according to the present embodiment includes lens body 141 and cut part 142. Lens body 141 and cut part 142 are an integrally molded article composed of a cured product of a liquid resin composition. The liquid resin composition is not particularly limited as long as the composition can transmit light with a desired wavelength, and has desired heat resistance. The liquid resin composition is, for example, a thermosetting resin composition. The thermosetting resin composition is, for example, a silicone resin composition.

Lens body 141 is configured to control a distribution of light emitted from light emitting element 130. In the present embodiment, lens body 141 includes incidence surface (first optical surface) 1411, bottom surface 1412 and emission surface (second optical surface) 1413. Lens body 141 includes a recess formed in the center part of the surface on the rear side thereof (light emitting element 130 side).

Incidence surface 1411 is disposed on the rear side of light flux controlling member 140, and constitutes the inner surface of the recess formed in lens body 141. Incidence surface 1411 is an optical surface which is configured to allow light emitted from light emitting element 130 to enter light flux controlling member 140 while controlling the traveling direction of the light. The shape of incidence surface 1411 may be appropriately set in accordance with the orientation of desired light. As described above, incidence surface 1411 is a recess-shaped and rotationally symmetrical surface, and the central axes of incidence surface 1411 and emission surface 1413 coincide with each other.

Bottom surface 1412 is disposed on the rear side of light flux controlling member 140, which is a flat surface extending outward from the opening edge of the recess (in the direction perpendicular to and away from central axis CA). Light flux controlling member 140 according to the present embodiment is disposed on base 120 so that bottom surface 1412 is in contact with the top surface of base 120. In other words, bottom surface 1412 serves as an installation surface when light flux controlling member 140 is disposed on base 120.

A structure for positioning may be formed in/on bottom surface 1412 and the top surface of base 120. In light flux controlling member 140 according to the present embodiment, protrusion 1414 for positioning is formed on bottom surface 1412. Recess 121 for positioning is formed in the top surface of base 120 (see FIG. 2). Light flux controlling member 140 can be easily disposed over light emitting element 130 at a suitable position by engaging protrusion 1414 for positioning with recess 121 for positioning. The numbers, shapes and positions of protrusion 1414 and recess 121 are not particularly limited as long as light flux controlling member 140 can be suitably positioned to light emitting element 130. The numbers of protrusions 1414 and recesses 121 are, for example, three each. Protrusion 1414 and recess 121 each has a shape of a column or a polygonal column. Protrusion 1414 and recess 121 are preferably disposed at positions where light emitted from light emitting element 130 is not blocked.

Emission surface 1413 is disposed on the front side of light flux controlling member 140. Emission surface 1413 is an optical surface which is configured to transmit light entering light flux controlling member 140 from incidence surface 1411, and to emit the light to the outside of light flux controlling member 140. The shape of emission surface 1413 may be appropriately set in accordance with the orientation of desired light.

Emission surface 1413 includes first emission surface 1413a positioned in a predetermined range around central axis CA, second emission surface 1413b continuously formed at the periphery of first emission surface 1413a, and third emission surface 1413c connecting second emission surface 1413b with the inner edge of the top surface (the surface on the front side of light flux controlling member 140) of cut part 142 (see FIG. 3C).

First emission surface 1413a is a smoothly curved surface protruding toward the rear side (light emitting element 130 side). Second emission surface 1413b is a smoothly curved surface positioned at the periphery of first emission surface 1413a and protruding toward the front side. Second emission surface 1413b has a toric convex shape. Third emission surface 1413c is a curved surface positioned at the periphery of second emission surface 1413b.

Cut part 142 was cut using a cutting blade or a laser during manufacturing of light flux controlling member 140. In plan view of light flux controlling member 140, cut part 142 extends outward (in the direction perpendicular to and away from central axis CA) from the entire circumference of the outer peripheral part of lens body 141. The shape of cut part 142 in plan view is not particularly limited, and may be annular or rectangular. In the present embodiment, the shape of cut part 142 is rectangular.

Outward-facing end surface 143 of cut part 142 is a cut surface formed by cutting using a cutting blade or a laser. In the case of cutting using a cutting blade, end surface 143 of cut part 142 bears a blade mark. The blade mark can be confirmed, for example, by detecting a streak caused by the cutting blade using an optical microscope. In the case of cutting using a laser, end surface 143 of cut part 142 bears a melting mark. The melting mark can be confirmed, for example, by detecting a sagging at the edge caused by the laser using an optical microscope. A burr caused by the cutting may be formed on end surface 143 of cut part 142. As described in detail below, during manufacturing of light flux controlling member 140 according to the present embodiment, the cutting is performed from the front side of light flux controlling member 140 using a cutting blade or a laser, and thus, a burr may be formed so as to protrude toward the rear side of light flux controlling member 140 (light emitting element 130 side).

Length (thickness) $d_1$ of cut part 142 in the front-rear direction of light flux controlling member 140 is not particularly limited, and e.g., 500 μm (see FIG. 2). Length $d_1$ of cut part 142 may be any length as long as the length is sufficient for resin filling during molding of below-described lens array sheet 150 having continuous light flux controlling members 140 (see FIG. 5A), and for supporting lens array sheet 150 pulled out from a mold in such a state that light flux controlling members 140 are continuously arranged in an array form. Length $d_2$ of cut part 142 in the extending direction (direction perpendicular to central axis CA) is not particularly limited either, and e.g., 100 μm or more (see FIG. 2). The upper limit of length $d_2$ of cut part 142 is not particularly limited. Length $d_2$ of cut part 142 is preferably no longer than necessary in view of increasing the number of light flux controlling members 140 formed per unit area in lens array sheet 150, and may be any length as long as the length is the minimum length necessary for being a processing margin in accordance with the width of a cutting blade or the beam diameter of a laser. In sectional view of light emitting device 100, length $d_3$ between end surfaces 143 of cut part 142 may be shorter than length $d_4$ between the outer peripheral edges of base 120. In other words, end surface 143 of cut part 142 may be positioned inside (central axis CA side of light flux controlling member 140) compared to the outer edge of base 120 in the extending direction. Length $d_3$ is only necessarily shorter than length $d_4$ in at least one cross-section including optical axis OA of light emitting element 130 (central axis CA of light flux controlling member 140). In other words, regarding cross-sections including optical axis OA, length $d_3$ may be shorter than length $d_4$ in some cross-sections, or in every cross-section.

In the front-rear direction of light flux controlling member 140, distance $d_5$ between the bottom surfaces of cut part 142 and lens body 141 is 20 μm or more. Distance $d_5$ can be appropriately adjusted in accordance with the size of a burr possibly formed at end surface 143 of cut part 142. Distance $d_5$ maybe any distance as long as it is longer than the length of the burr protruding on the rear side and from the bottom surface of cut part 142, in the front-rear direction. The size of a burr can be appropriately adjusted in accordance with the material for light flux controlling member 140 or a cutting method (the speed and pressure during cutting).

[Method for Manufacturing Light Emitting Device]

Hereinafter, a method for manufacturing light emitting device 100 will be described. The method for manufacturing light emitting device 100 according to the present embodiment includes steps of: providing substrate 110, base 120 and light emitting element 130; molding lens array sheet 150; cutting lens array sheet 150 using a cutting blade or a laser; and assembling light emitting device 100. Light flux controlling member 140 can be manufactured by the molding and cutting steps.

(Providing Step)

Substrate 110, base 120 and light emitting element 130 are provided. Substrate 110, base 120 and light emitting element 130 may be, e.g., ready-made articles. Base 120 and light emitting element 130 may be formed into a ready-made package.

(Molding Step)

Figure 4A:
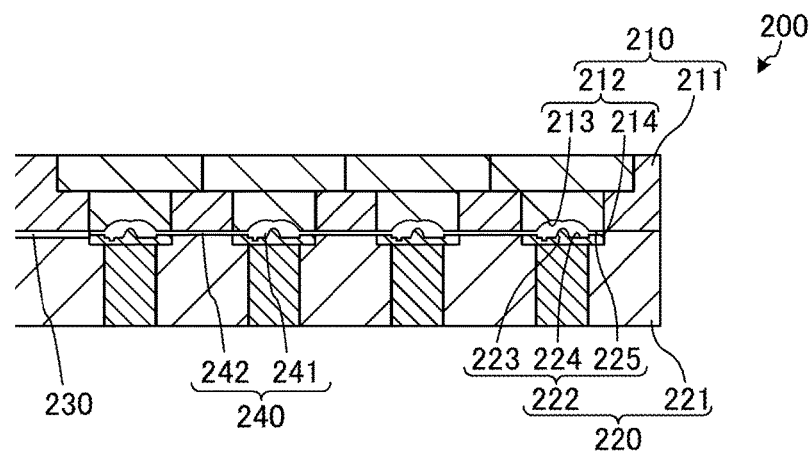
FIGS. 4A to 4C are sectional schematic views for describing a molding step of a lens array sheet.
Figure 4B:
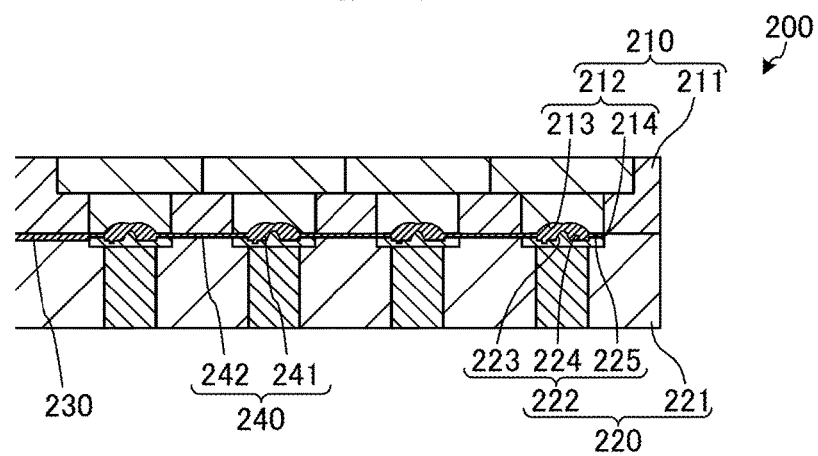
Figure 4C:
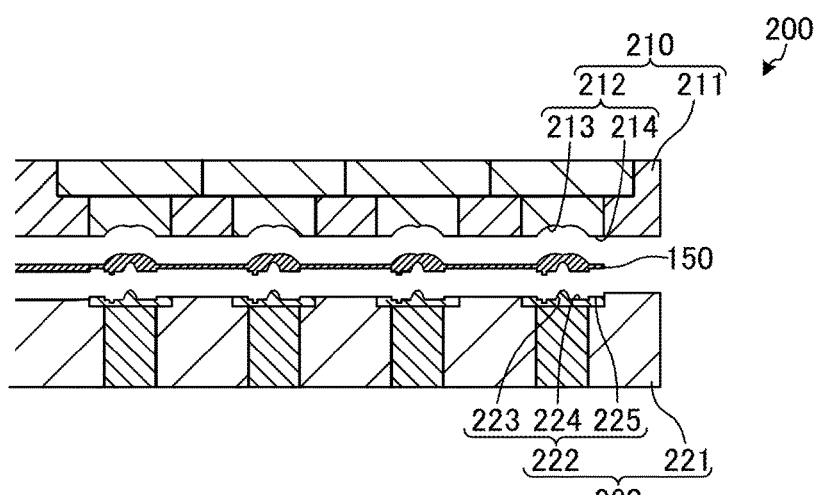

As a next step, lens array sheet 150 is molded by filling a cavity of mold 200 with a liquid resin composition, followed by curing the composition. FIGS. 4A to 4C are sectional schematic views for describing the molding step of lens array sheet 150. In the present embodiment, lens array sheet 150 is an integrally molded article including a plurality of lens bodies 141 and connecting parts 144 which connect lens bodies 141. Each of connecting parts 144 extends outward from the entire circumference of the outer peripheral part of lens body 141 (see FIG. 5A).

First, mold 200 used in the molding step is described, and then the molding of lens array sheet 150 using mold 200 is described. Mold 200 includes first mold 210 and second mold 220. Although not illustrated, mold 200 is configured so as to be connectable with injection apparatus including a material feeder, material mixer, nozzles and the like. This allows the injection apparatus to fill the cavity of clamped mold 200 (first mold 210 and second mold 220) with a liquid resin composition.

First mold 210 is a mold piece for molding the front surface of light flux controlling member 140. First mold 210 includes first mold body 211 and sixteen front surface molding parts 212 (only four are illustrated in FIGS. 4A to 4C).

First mold body 211 is a mold piece for supporting front surface molding parts 212.

Front surface molding part 212 is a mold piece for molding the surface on the front side of lens body 141. Front surface molding part 212 includes first curved surface transferring surface 213 and first flat surface transferring surface 214. First curved surface transferring surface 213 and first flat surface transferring surface 214 are disposed so as to face second mold 220.

First curved surface transferring surface 213 is the inner surface of a recess formed in the center part of front surface molding part 212. First curved surface transferring surface 213 is formed to have a shape corresponding to emission surface 1413 of lens body 141.

First flat surface transferring surface 214 is formed at the periphery of first curved surface transferring surface 213. First flat surface transferring surface 214 is a flat surface corresponding to the top surface of connecting part 144 (cut parts 142).

Second mold 220 is a mold piece for molding the rear surface of light flux controlling member 140. Second mold 220 includes second mold body 221 and sixteen rear surface molding parts 222 (only four are illustrated in FIGS. 4A to 4C).

Second mold body 221 is a mold piece for supporting rear surface molding parts 222. In second mold body 221, a groove and a (below-described) recess are formed, which are to be filled with a liquid resin composition when first mold 210 and second mold 220 are clamped. When first mold 210 and second mold 220 are clamped, the groove serves as introduction hole 230 for introducing a liquid resin composition into cavities 240.

Rear surface molding part 222 is a mold piece for molding the surface on the rear side of lens body 141. Rear surface molding part 222 includes second curved surface transferring surface 223, second flat surface transferring surface 224 and third flat surface transferring surface 225. Second curved surface transferring surface 223, second flat surface transferring surface 224 and third flat surface transferring surface 225 are disposed so as to face first mold 210.

Second curved surface transferring surface 223 is the surface of a protrusion formed in the center part of rear surface molding part 222. Second curved surface transferring surface 223 is formed to have a shape corresponding to incidence surface 1411 of lens body 141.

Second flat surface transferring surface 224 is formed at the periphery of second curved surface transferring surface 223. Second flat surface transferring surface 224 is a flat surface corresponding to bottom surface 1412 of lens body 141. In the present embodiment, second flat surface transferring surface 224 include a recess corresponding to protrusion 1414 for positioning.

Third flat surface transferring surface 225 is formed at the periphery of second flat surface transferring surface 224. Third flat surface transferring surface 225 is a flat surface corresponding to the bottom surface of cut part 142.

Second flat surface transferring surface 224 and third flat surface transferring surface 225 are formed so as to have a distance therebetween of 20 µm or more in the direction in which first mold 210 and second mold 220 face each other.

When first mold 210 and second mold 220 are clamped, cavities 240 are formed therebetween. In this instance, each first cavity 241 for lens body 141 is formed between first curved surface transferring surface 213, and second curved surface transferring surface 223 and second flat surface transferring surface 224. Each second cavity 242 for connecting part 144 is formed between first flat surface transferring surface 214 and the above-mentioned recess of first mold body 211, and third flat surface transferring surface 225 and the surface of second mold body 221.

Molding of lens array sheet 150 using mold 200 is now described.

Firstly, as illustrated in FIG. 4A, first mold 210 and second mold 220 are clamped. This allows first mold body 211 to cover the groove formed in second mold body 221, thereby forming introduction hole 230 and cavities 240. Introduction hole 230 communicates with cavity 240 (second cavity 242).

As illustrated in FIG. 4B, cavities 240 of mold 200 are then filled with a liquid resin composition from non-illustrated injection apparatus, followed by curing the composition (Liquid Injection Molding; LIM). Specifically, cavities 240 of mold 200 heated at a predetermined temperature are filled with a liquid resin composition using the injection apparatus. During the filling, introduction hole 230 and cavities 240 are filled in this order with the liquid resin composition injected from the injection apparatus.

The liquid resin composition filling cavities 240 is cured. For example, when the liquid resin composition is a thermosetting resin, the liquid resin composition filling cavities 240 is heated in mold 200 and thermally cured. The temperatures of first mold 210 and second mold 220 (molding temperature) may be appropriately set in view of, for example, the flow velocity and flow distance of the liquid resin composition. The temperatures of first mold 210 and second mold 220 are, for example, about 130 to 220° C.

The filling time and filling pressure of the liquid resin composition may also be appropriately set, and, for example, the filling time is about 0.3 to 3 seconds, and the filling pressure is about 13 MPa.

Lastly, as illustrated in FIG. 4C, mold 200 is opened, and lens array sheet 150 (integrally molded article of lens bodies 141 and connecting parts 144) that is a cured product of the liquid resin composition is pulled out of the mold.

Lens array sheet 150 can be manufactured by the above procedures. The processes of the molding step can be carried out in about 30 seconds to 5 minutes. Lens array sheet 150 is molded so that each distance in the front-rear direction thereof between the bottom surfaces of connecting part 144 and lens body 141 is 20 µm or more.

(Cutting Step)

Figure 5A:
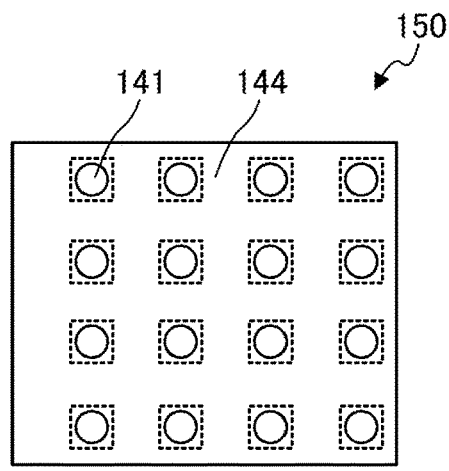
FIGS. 5A to 5C describe a manufacturing step of a light emitting device according to the embodiment.
Figure 5B:
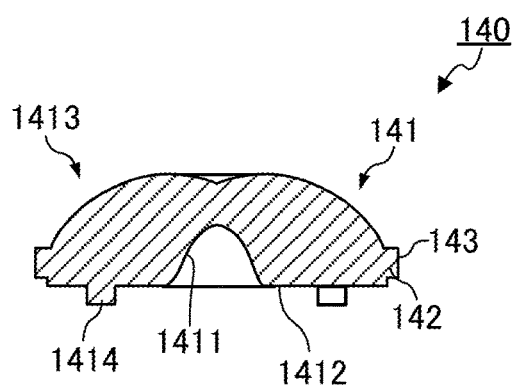
Figure 5C:
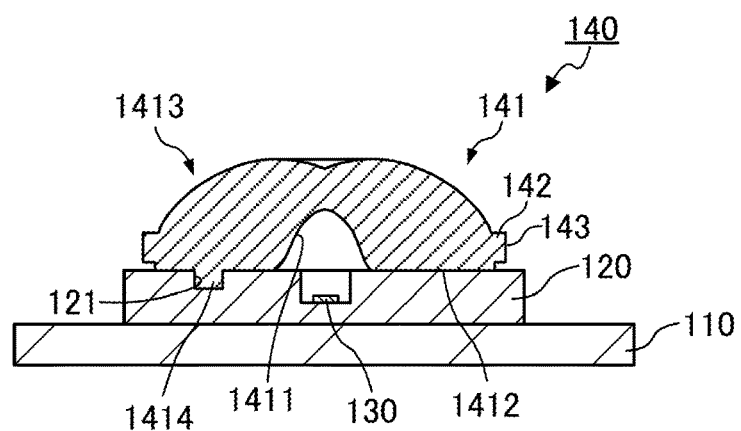

As a next step, connecting parts 144 of integrally molded lens array sheet 150 (molded article) are cut from the front side using a cutting blade or a laser. FIGS. 5A to 5C describe a manufacturing step of light emitting device 100 (cutting and assembling steps) according to the embodiment. Specifically, in each connecting part 144, a part denoted with a broken line in FIG. 5A is cut from the front side of lens array sheet 150 using a cutting blade or a laser. This enables obtainment of a plurality of light flux controlling members 140. The method for cutting lens array sheet 150 may be appropriately selected from conventional cutting methods using a cutting blade or a laser. Examples of the cutting methods using a cutting blade include straight cutting using a rotary blade or Thomson blade (straight blade), and punching using a pinnacle die (etched blade) or a mobile die (NC chisel). In any case where one of the methods is used, the length of a burr protruding on the rear side and from the end surface of connecting part 144 (cut parts 142) becomes less than 500 μm.

(Assembling Step)

As the last step, light emitting device 100 is assembled (see FIG. 2). Light emitting element 130 and base 120 are formed into a package by disposing and fixing light emitting element 130 in a recess of base 120. The method for fixing light emitting element 130 to base 120 is not particularly limited. For example, light emitting element 130 can be fixed on base 120 by sealing the recess of base 120, in which light emitting element 130 is disposed, with a resin transmitting light emitted from light emitting element 130. Subsequently, base 120 forming a package with light emitting element 130 is disposed and fixed on substrate 110. The method for fixing base 120 to substrate 110 is not particularly limited, either. Base 120 can be fixed on substrate 110, e.g., by thermal fusing or with an adhesive.

Light flux controlling member 140 is then disposed and fixed in such a manner that the light emitting surface of light emitting element 130 faces incidence surface 1411 of lens body 141, and bottom surface 1412 of light flux controlling member 140 (lens body 141) is in contact with the top surface of base 120. The method for fixing light flux controlling member 140 to base 120 is not particularly limited, either. Light flux controlling member 140 can be fixed on base 120, e.g., by thermal fusing or with an adhesive.

Light emitting device 100 according to the present embodiment can be manufactured by the above procedures.

(Effects)

Light flux controlling member 140 according to the present embodiment is configured in such a manner that the distance between the bottom surface of cut part 142 and bottom surface 1412 of lens body 141 becomes 20 μm or more in the front-rear direction of light flux controlling member 140. Accordingly, even if a burr protruding from the rear side is formed during the manufacturing step of light flux controlling member 140 (in the cutting step), a tilt of light flux controlling member 140 due to the burr being in contact with the top surface of base 120 does not occur, and thus, light flux controlling member 140 can be suitably disposed over light emitting element 130. Therefore, light flux controlling member 140 according to the present embodiment can be disposed during mounting without lowering of light distribution properties thereof, even with a burr being formed during manufacturing of the same.

Figure 6A:
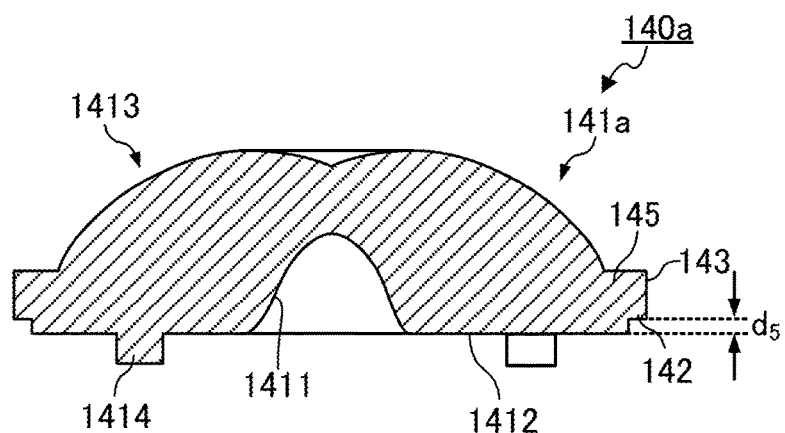
FIGS. 6A and 6B are sectional views of light flux controlling members according to Modifications 1 and 2 of the embodiment.
Figure 6B:
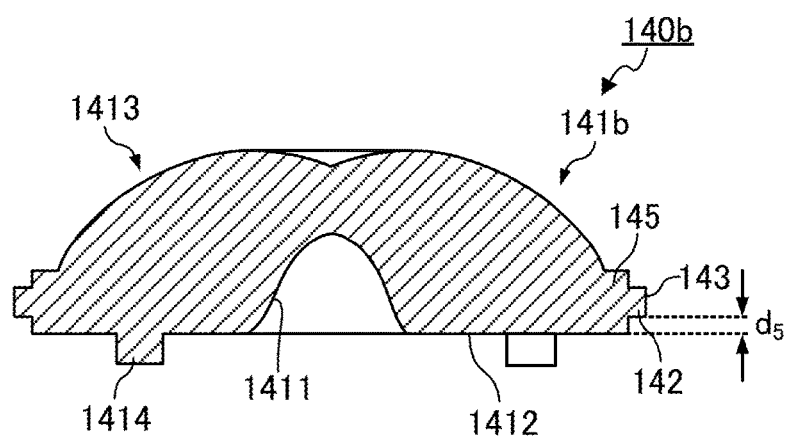

In the above embodiment, light flux controlling member 140 is described, in which cut part 142 protrudes outward from emission surface 1413 of lens body 141; however, cut part 142 may protrude from another portion of the outer peripheral part of lens body 141. FIGS. 6A and 6B are sectional views of light flux controlling members 140a and 140b according to Modifications 1 and 2. FIG. 6A is a sectional view of light flux controlling member 140a according to Modification 1, and FIG. 6B is a sectional view of light flux controlling member 140b according to Modification 2.

As illustrated in FIGS. 6A and 6B, lens bodies 141a and 141b may further include flange 145 disposed at the outer peripheral part thereof in plan view of light flux controlling members 140a and 140b, respectively. In this case, cut part 142 extends outward from the entire circumference of the outer peripheral part of flange 145 in plan view of each of light flux controlling members 140a and 140b.

The position of cut part 142 in the front-rear direction of each of light flux controlling members 140a and 140b is not particularly limited, as long as distance $d_5$ between the bottom surface of cut part 142 and bottom surface 1412 of lens body 141 becomes 20 μm or more in the front-rear direction. For example, the positions of the top surfaces of flange 145 and cut part 142 may be the same as illustrated in FIG. 6A, or different as illustrated in FIG. 6B.

Figure 7:
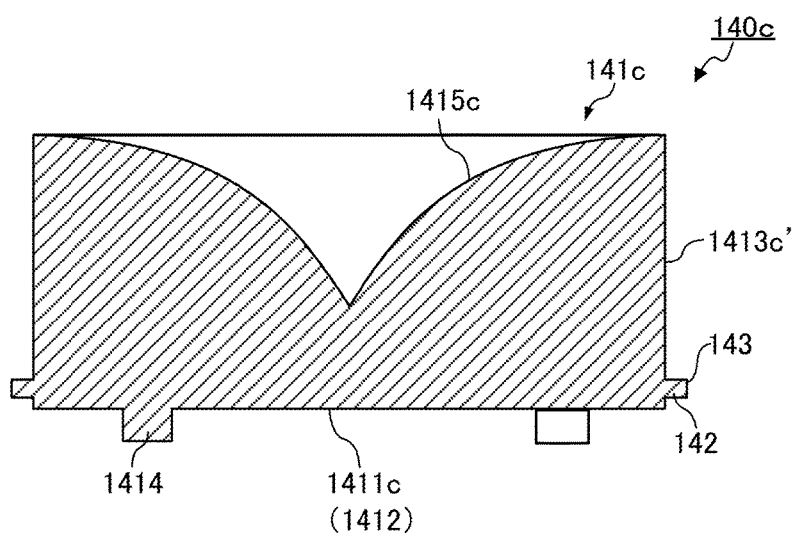
FIG. 7 is a sectional view of a light flux controlling member according to Modification 3 of the embodiment.

Further, in the above embodiment, a case is described in which the optical surface on the front side of light flux controlling member 140 is a transmission surface (emission surface) configured to emit light incident on incidence surface 1411 to the outside of light flux controlling member 140; however, the optical surface on the front side of a light flux controlling member may be a reflection surface according to the present invention. FIG. 7 is a sectional view of light flux controlling member 140c according to Modification 3. As illustrated in FIG. 7, when the optical surface on the front side of light flux controlling member 140c is reflection surface 1415c, lens body 141c further include emission surface 1413c' (which is referred to as "third optical surface" in the claims) disposed so as to surround reflection surface 1415c. Reflection surface 1415c reflects light entering light flux controlling member 140c from incidence surface 1411c. Emission surface 1413c' emits light reflected by reflection surface 1415c to the outside of light flux controlling member 140c.

Furthermore, in the above embodiment, light flux controlling member 140 in which a recess is formed in bottom surface 1412 is described; however, a light flux controlling member according to the present invention is not limited to such a mode. For example, a recess may not be formed in the bottom surface of a light flux controlling member according to the present invention. In this case, an incidence surface (first optical surface) is a flat surface (see FIG. 7).

INDUSTRIAL APPLICABILITY

A light flux controlling member according to the present invention may be employed, for example, as a light flux controlling member for controlling a distribution of light emitted from a light source in a backlight of liquid crystal display apparatus or a general lighting.

REFERENCE SIGNS LIST

1 Lens array sheet
2 Adhesive sheet
3 Resin substrate
4 Lens body
5 Notched section
100 Light emitting device
110 Substrate
120 base
121 Recess for positioning
130 Light emitting element
140, 140a to 140c Light flux controlling member
141, 141a to 141c Lens body
1411, 1411c Incidence surface
1412 Bottom surface
1413, 1413c' Incidence surface
1413a First emission surface
1413b Second emission surface
1413c Third emission surface
1414 Protrusion for positioning
1415c Reflection surface
142 Cut part 143 End surface of cut part
144 Connecting part
145 Flange
150 Lens array sheet
200 Mold
210 First mold
211 First mold body
212 Front surface molding part
213 First curved surface transferring surface
214 First flat surface transferring surface
220 Second mold
221 Second mold body
222 Rear surface molding part
223 Second curved surface transferring surface
224 Second flat surface transferring surface
225 Third flat surface transferring surface
230 Introduction hole
240 Cavity
241 First cavity
242 Second cavity
CA Central axis of lens body
OA Optical axis of light emitting element

The invention claimed is:

1. A light flux controlling member configured to control distribution of light emitted from a light emitting element, the light flux controlling member comprising:
    a lens body which includes:
        a first optical surface disposed on a rear side of the light flux controlling member and configured to allow light emitted from a light emitting element to enter the light flux controlling member, and
        a second optical surface disposed on a front side of the light flux controlling member and configured to transmit or reflect the light entering from the first optical surface;
    a cut part extending outward from an entire circumference of an outer peripheral part of the lens body in plan view of the light flux controlling member,
    wherein the lens body and the cut part are an integrally molded article composed of a cured product of a liquid resin composition, the liquid resin composition being a thermosetting resin composition,
    wherein the cut part includes an outward-facing end surface bearing a blade mark or a melting mark, and
    wherein in a front-rear direction of the light flux controlling member, a distance between bottom surfaces of the cut part and the lens body is 20 μm or more.

2. The light flux controlling member according to claim 1, wherein:
    the lens body further includes a flange disposed at the outer peripheral part of the lens body in plan view of the light flux controlling member, and
    the cut part extends outward from an entire circumference of an outer peripheral part of the flange in plan view of the light flux controlling member.

3. The light flux controlling member according to claim 1, wherein the thermosetting resin composition is a silicone resin composition.

4. The light flux controlling member according to claim 1, wherein the second optical surface is an emission surface configured to emit the light entering from the first optical surface to an outside of the light flux controlling member.

5. The light flux controlling member according to claim 1, wherein:
    the lens body further includes a third optical surface disposed so as to surround the second optical surface,
    the second optical surface is a reflection surface configured to reflect the light entering the light flux controlling member from the first optical surface, and
    the third optical surface is an emission surface configured to emit the light reflected on the second optical surface to an outside of the light flux controlling member.

6. A light emitting device comprising:
    a light emitting element;
    a base supporting the light emitting element; and
    the light flux controlling member according to claim 1 disposed over the light emitting element,
    wherein the light flux controlling member is disposed so that a light emitting surface of the light emitting element faces the first optical surface, and the bottom surface of the lens body is in contact with a top surface of the base.

7. The light emitting device according to claim 6, wherein a length between the end surfaces of the cut part is shorter than a length between outer peripheral edges of the top surface of the base, in at least one cross-section including an optical axis of the light emitting element.

8. A method for manufacturing a light flux controlling member configured to control distribution of light emitted from a light emitting element, the method comprising:
    integrally molding a plurality of lens bodies and connecting parts to form a molded article by filling a cavity of a mold with a liquid resin composition followed by curing the liquid resin composition,
    wherein each lens body including:
        a first optical surface disposed on a rear side of the lens body and configured to allow light emitted from a light emitting element to enter the lens body, and
        a second optical surface disposed on a front side of the lens body and configured to transmit or reflect the light entering from the first optical surface,
    wherein each connecting part extending outward from an entire circumference of an outer peripheral part of the lens body and connecting the lens bodies, and
    wherein the liquid resin composition being a thermosetting resin composition; and
    cutting the connecting parts of the molded article from a front side thereof using a cutting blade or a laser,
    wherein during the integrally molding of the lens bodies and the connecting parts, the molded article is integrally molded so that a distance between bottom surfaces of the connecting part and the lens body becomes 20 μm or more in a front-rear direction.

9. The method for manufacturing a light flux controlling member according to claim 8, wherein the thermosetting resin composition is a silicone resin composition.

* * * * *